(12) United States Patent
Lo et al.

(10) Patent No.: US 6,821,911 B1
(45) Date of Patent: Nov. 23, 2004

(54) MANUFACTURING METHOD OF CARBON NANOTUBE TRANSISTORS

(75) Inventors: Po-Yuan Lo, Hsinchu (TW); Jih-Shun Chiang, Hsinchu (TW); Jeng-Hua Wei, Hsinchu (TW); Chien-Liang Hwang, Hsinchu (TW); Hung-Hsiang Wang, Hsinchu (TW); Ming-Jiunn Lai, Hsinchu (TW); Ming-Jer Kao, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 10/727,500

(22) Filed: Dec. 5, 2003

(30) Foreign Application Priority Data

Aug. 20, 2003 (TW) ........................................ 92122853 A

(51) Int. Cl.⁷ ........................................... H01L 21/649
(52) U.S. Cl. ........................ 438/780; 438/642; 438/625; 438/637; 438/778; 438/253; 438/254
(58) Field of Search ................................. 438/780, 778, 438/637, 642, 625, 197, 585, 253, 254, 268

(56) References Cited

U.S. PATENT DOCUMENTS 6,515,339 B2 * 2/2003 Shin et al. .................. 257/368
2002/0163079 A1 * 11/2002 Awano ........................ 257/750
2003/0178617 A1 * 9/2003 Appenzeller et al. ......... 257/20
2003/0214054 A1 * 11/2003 Awano et al. ............... 257/797
2004/0036128 A1 * 2/2004 Zhang et al. ................ 257/401
2004/0132070 A1 * 7/2004 Star et al. ...................... 435/6

* cited by examiner

Primary Examiner—Matthew Smith
Assistant Examiner—Igwe U. Anya
(74) Attorney, Agent, or Firm—Birch, Stewart, Kolasch & Birch, LLP

(57) ABSTRACT

A manufacturing method of carbon nanotube transistors is disclosed. The steps include: forming an insulating layer on a substrate; forming a first oxide layer on the insulating layer using a solution with cobalt ion catalyst by spin-on-glass (SOG); forming a second oxide layer on the first oxide layer using a solution without the catalyst; forming a blind hole on the second oxide layer using photolithographic and etching processes, the blind hole exposing the first oxide layer, the sidewall of the second oxide layer, and the insulating layer; forming a single wall carbon nanotube (SWNT) connecting the first oxide layer separated by the blind hole and parallel to the substrate; and forming a source and a drain connecting to both ends of the SWNT, respectively.

26 Claims, 9 Drawing Sheets

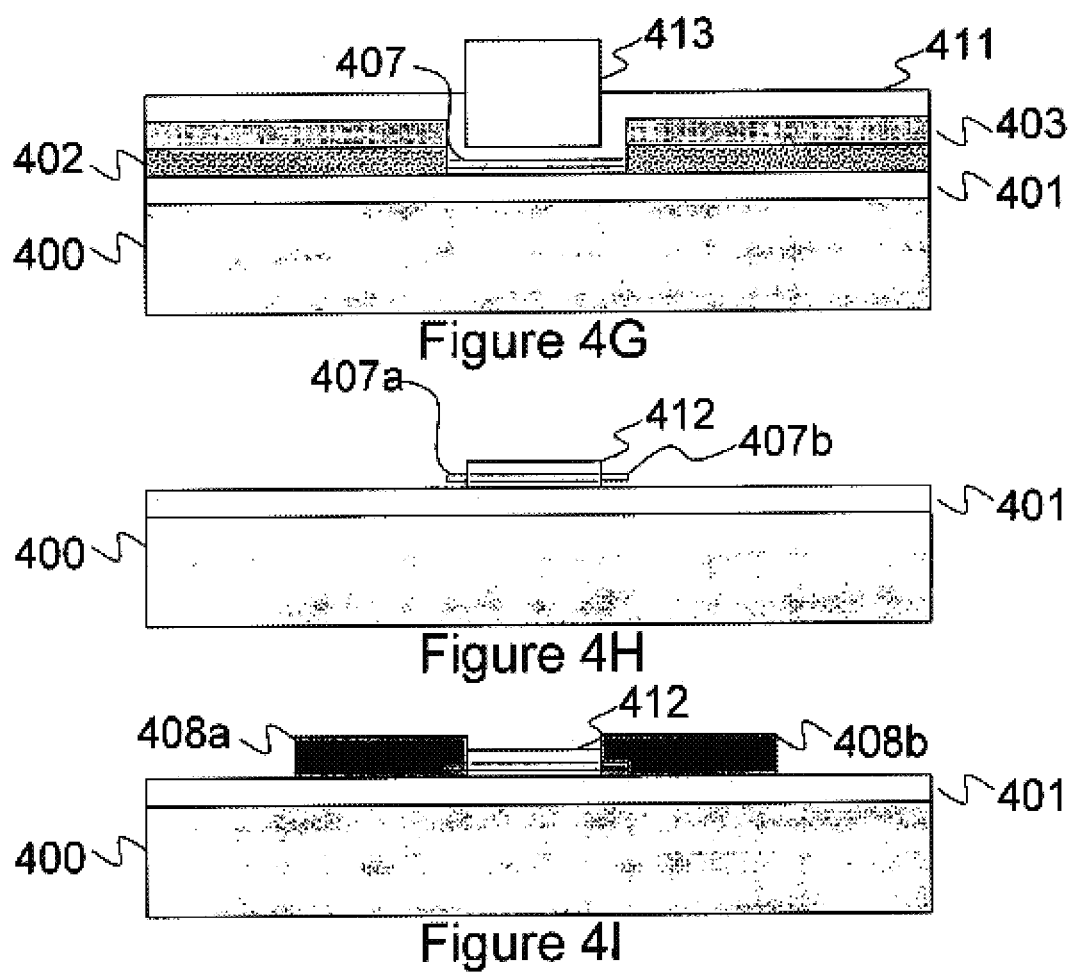

US 6,821,911 B1

MANUFACTURING METHOD OF CARBON NANOTUBE TRANSISTORS

BACKGROUND OF THE INVENTION

This Nonprovisional application claims priority under 35 U.S.C. § 119(a) on Patent Application No(s). 092122853 filed in Taiwan on Aug. 20, 2003, the entire contents of which are hereby incorporated by reference.

1. Field of Invention

The invention relates to a manufacturing method of transistors and, in particular, to a manufacturing method of carbon nanotube transistors.

2. Related Art

In the trend of miniaturization, the manufacturing processes of the integrated circuit (IC) based upon silicon wafers are facing bottleneck problems in optics and physics and pressures from research investments. People have started trying various kinds of nanotransistors made from nanomolecules, so that hundreds of times more transistors than the prior art can be put into a same area. A nanometer is one-billionth meter. In the development of all sorts of nanotransistors, the technique that uses carbon nanotubes as the basic building blocks is the fastest. It is expected to be the best material for nano-grade computer products in the next generation.

The carbon nanotube was discovered by Japan NEC researcher in 1991 when he was studying carbon family chemicals. It is a cylindrical carbon material with a diameter between 1 and 30 nanometers. The carbon nanotube is known to be the thinnest tube discovered in Nature. It is thermally conductive, electrically conductive, robust, chemically stable, and soft. It is mainly comprised of one or several layers of unsaturated graphene layer. These little tubes are actually elliptical micro molecules. They are formed under high temperatures in the water vapor generated by carbon arc and laser. The central portion of the carbon nanotube graphene layer completely consists of six-cite rings. Both ends of the turning points have five- or seven-cite rings. Each carbon atom has the SP2 structure. Basically, the structure and chemical properties of the graphene layer on the carbon nanotube are similar to carbon sixty (C60). The carbon nanotubes can be semiconductors or conductors. Because of this special property, the carbon nanotube plays an important role in electronic circuits.

A necessary condition for using carbon nanotubes in future circuits is that they can be used to make transistors. The semiconductor carbon nanotube can be used as the gate in a field effect transistor (FET). Imposing a voltage can increase its conductivity to be 106 times that of the silicon semiconductor. The operating frequency can reach 1012 Hz, which is 1000 times the frequency that can reached by current CMOS. IBM has successfully used individual single wall or multi wall carbon nanotube as the channel of FET's to obtain carbon nanotube transistors for test. The single wall carbon nanotubes (SWNT's) consist of a single shell of carbon atoms. The so-called CNT is a macro carbon molecule with many properties. There are single wall CNT (SWCNT) and multiple wall CNT (MWCNT). There are three kinds of carbon nanotube preparation methods. The first is called the plasma discharging method; the second is called the laser ablation method; and the third is called the metal catalyst thermal chemical vapor deposition method, in which the carbon nanotubes are formed by using iron, cobalt, and nickel metal particles to thermally decompose acetylene or methane in a high-temperature furnace.

Using the reactions in the third type carbon nanotube production method, the disclosed manufacturing method of carbon nanotube FET's does not require the use of highly pollutant alkaline metals. The processes involved are very simple and compatible with existing IC processes.

SUMMARY OF THE INVENTION

An objective of the invention is to provide a manufacturing method of carbon nanotube transistors to solve the foregoing problems and difficulties in the prior art.

Another objective of the invention is to provide a manufacturing method of carbon nanotube transistors to simplify the conventional production processes. With currently available equipment, the production and research costs can be greatly reduced.

We disclose a general embodiment to demonstrate the invention can achieve the above objectives. The detailed steps include: forming an insulating layer on a substrate; forming a first oxide layer on the insulating layer using a solution with cobalt ion catalyst by spin-on-glass (SOG); forming a second oxide layer on the first oxide layer using a solution without the catalyst; forming a blind hole on the second oxide layer using photolithographic and etching processes, the blind hole exposing the first oxide layer, the sidewall of the second oxide layer, and the insulating layer; forming a single wall carbon nanotube (SWNT) connecting the first oxide layer separated by the blind hole and parallel to the substrate; and forming a source and a drain connecting to both ends of the SWNT, respectively.

BRIEF DESCRIPTION OF THE DRAWINGS

The invention will become more fully understood from the detailed description given hereinbelow illustration only, and thus are not limitative of the present invention, and wherein:

FIGS. 4A through 4I show cross-sectional views of the production steps in the fourth embodiment of the invention.

DETAILED DESCRIPTION OF THE INVENTION

FIGS. 1A through 1F show the production steps of the carbon nanotube transistors according to a first embodiment of the invention.

Figure 1A:
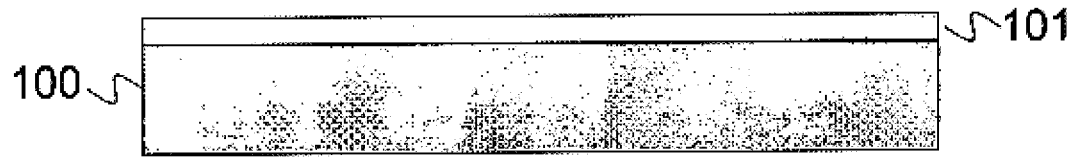
FIGS. 1A through 1F show cross-sectional views of the production steps in the first embodiment of the invention.

As shown in FIG. 1A, an insulating layer 101 is formed on a substrate 100. The insulating layer 101 can be made of $SiO_2$ or $Si_xN_y$ using the chemical vapor deposition (CVD) method.

Figure 1B:
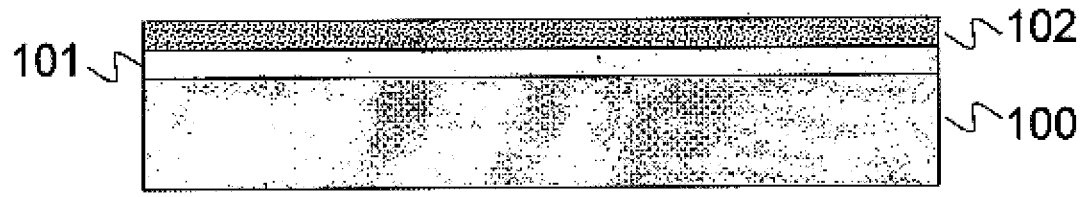

With reference to FIG. 1B, a first oxide layer 102 containing a catalyst is formed on the insulating layer 101. First, a coating solution is prepared. The coating solution is applied on the insulating layer 101 by the SOG method. Finally, the coating solution layer (not shown) on the insulating layer is dried in two steps. The coating solution consists of at least a solution containing TEOS, pure alcohol and catalyst ions. One can also add an ammonia solution ($NH_4OH$+alcohol). The catalyst ion can be cobalt, nickel, or iron ion. The two-step drying includes drying at the temperature of 100~120° C. for one hour and then drying at the temperature of 350~500° C. for another hour.

Figure 1C:

As shown in FIG. 1C, a second oxide layer without the catalyst is formed on the first oxide layer 102. First, a coating solution is prepared and applied on the first oxide layer 102 by the SOG method. Afterwards, the coating solution layer (not shown) is dried. The coating solution consists at least a TEOS solution.

Figure 1D:
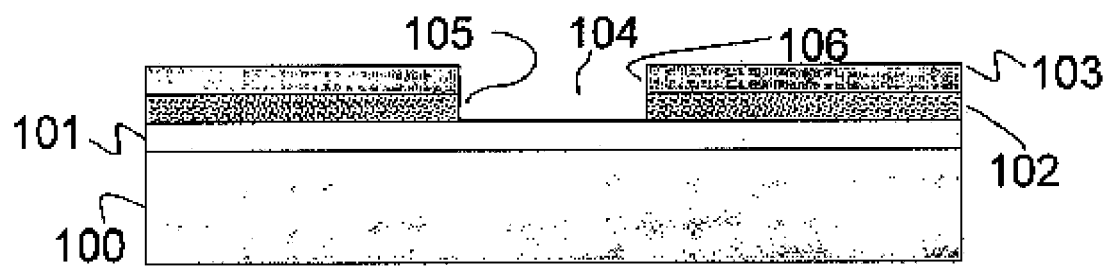

As shown in FIG. 1D, after exposure and developing using a mask, a blind hole 104 is formed by dry or wet etching. The blind hole 104 exposes part of the insulating layer 101, the sidewall 105 of the first oxide layer 102, and the sidewall 106 of the second oxide layer 103.

Figure 1E:
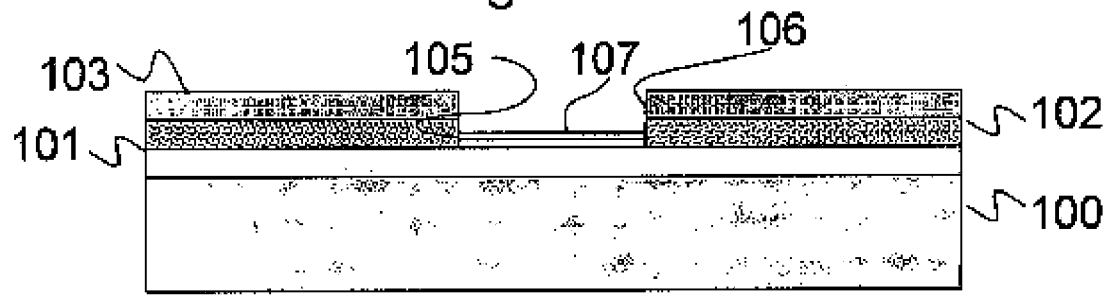

As shown in FIG. 1E, a carbon nanotube 107 is formed. Both ends of the carbon nanotube 107 are connected to the sidewall 105 of the first oxide layer 102. The alcohol ($C_2H_5OH$) inside the first oxide layer 102 is the reactant for the carbon nanotube 107. It reacts with the catalyst inside the first oxide layer 102 under the temperature of 850° C. The reason it does not form the carbon nanotube between the sidewall 106 of the second oxide layer is that there is no reactant and catalyst in the second oxide layer 103. Thus, the carbon nanotube 107 can be fixed between the sidewall 105 of the first oxide layer 102.

Figure 1F:
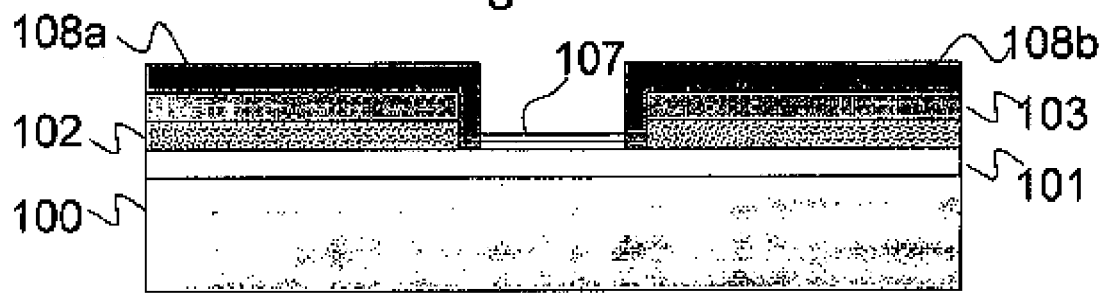

As shown in FIG. 1F, a source 108a and a drain 108b are connected to both ends of the carbon nanotube 107, respectively. The source 108a and the drain 108b can be formed using electron-beam (E-beam) photolithography along with a lift-off means.

Please refer to FIGS. 2A through 2F for the production steps in a second embodiment of the invention.

Figure 2A:
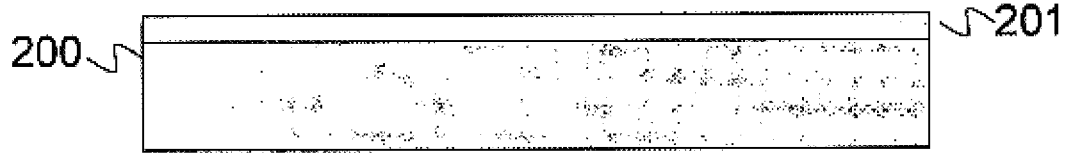
FIGS. 2A through 2F show cross-sectional views of the production steps in the second embodiment of the invention.

As shown in FIG. 2A, a first insulating layer 201 is formed on a substrate 200. The insulating layer 201 can be made of $SiO_2$ or $Si_xN_y$ using the chemical vapor deposition (CVD) method.

Figure 2B:

With reference to FIG. 2B, a source 208a and a drain 208b are formed on the first insulating layer 201. The detailed steps include using metal sputtering to form a metal layer (not shown) on the first insulating layer 201 and using photolithography and etching to form the source 208a and the drain 208b. They are separated by a gap 204. The metal can be titanium.

Figure 2C:
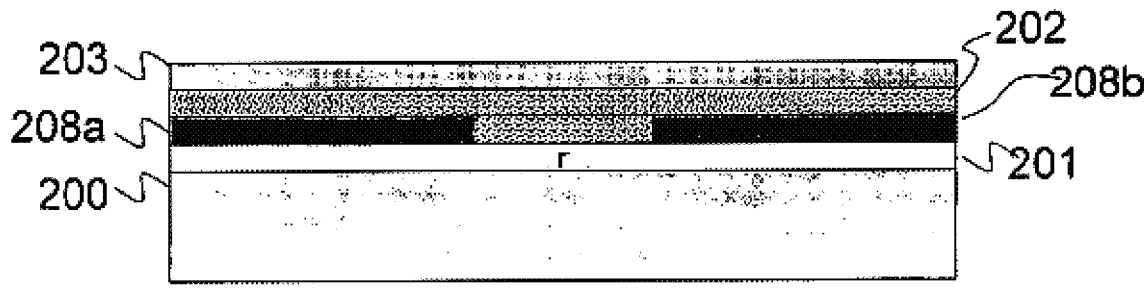

As shown in FIG. 2C, a first oxide layer 202 with a catalyst and a second oxide layer 203 with no catalyst are formed on the substrate 200 that has the source 208a, the drain 208b, and the first insulating layer 201. To form the first oxide layer, one first prepares a coating solution and applies the coating solution on the source 208a and the drain 208b by the SOG method, filling the gap 204. Afterwards, the coating solution layer (not shown) covering the source 208a, the drain 208b, and the gap 204 is dried. The coating solution for the first oxide layer 202 consists of at least a solution containing TEOS, pure alcohol and catalyst ions. One can also add an ammonia solution ($NH_4OH$+alcohol). The catalyst ion can be cobalt, nickel, or iron ion. To form the second oxide layer 203, one first prepares a coating solution and applies the coating solution on the first oxide layer 202 by the SOG method. Afterwards, the coating solution (not shown) on the first oxide layer is dried. The coating solution here consists of at least a TEOS solution.

Figure 2D:
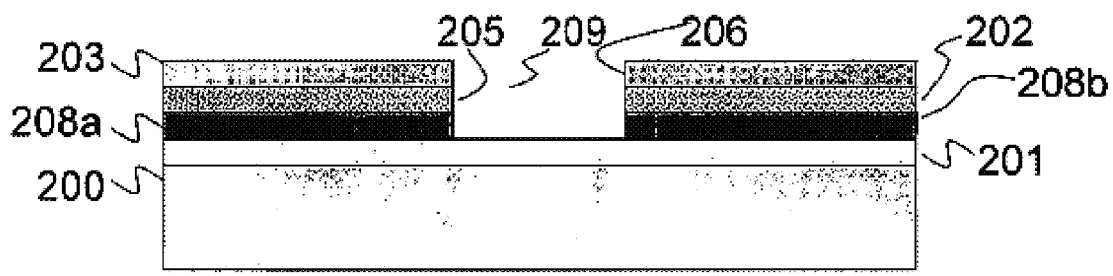

As shown in FIG. 2D, after exposure and developing using a mask, a blind hole 209 is formed by dry or wet etching. The blind hole 209 exposes part of the insulating layer 201, the sidewall 205 of the first oxide layer 202, the sidewall 206 of the second oxide layer 203, and the sidewall 210 of the source 208a and the drain 208b.

Figure 2E:
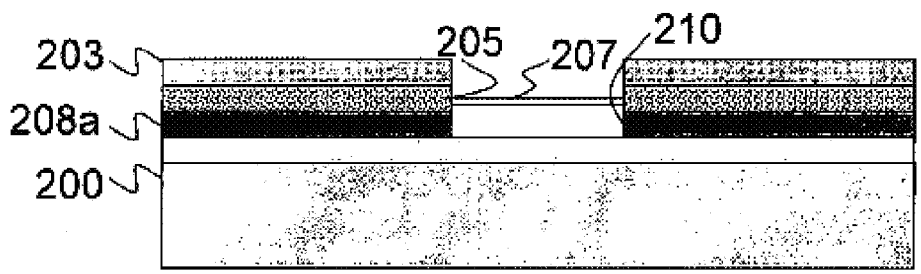

As shown in FIG. 2E, a carbon nanotube 207 is formed. Both ends of the carbon nanotube 207 are connected to the sidewall 205 of the first oxide layer 202. The alcohol ($C_2H_5OH$) inside the first oxide layer 202 is the reactant for the carbon nanotube 207. It reacts with the catalyst inside the first oxide layer 202 under the temperature of 850° C. The reason it does not form the carbon nanotube between the sidewall 206 of the second oxide layer is that there is no reactant and catalyst in the second oxide layer 203. Thus, the carbon nanotube 207 can be fixed between the sidewall 205 of the first oxide layer 202.

Figure 2F:
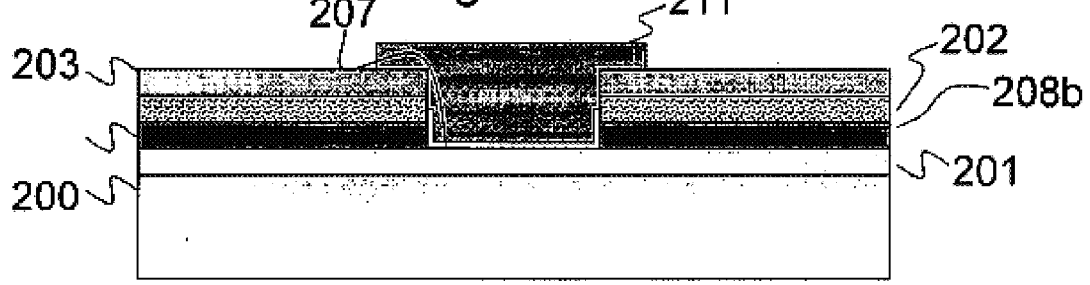

As shown in FIG. 2F, a second insulating layer 211 is formed on the second oxide layer 203 that contains the blind hole 209. The forming method can be the CVD method. Once the second insulating layer 211 fills the blind hole 209, it pushes down the carbon nanotube 207 in the blind hole 209. The carbon nanotube 207 thus has a concave shape and touches the sidewall 210 of the source 208a, the drain 208b and part of the first insulating layer 201. Therefore, the carbon nanotube 207 connects the source 208a and the drain 208b. The second insulating layer consists of $SiO_2$ or $Si_xN_y$.

Please refer to FIGS. 3A through 3F for the production steps in a third embodiment of the invention.

Figure 3A:
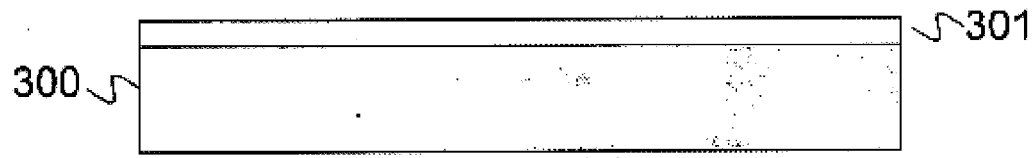
FIGS. 3A through 3E show cross-sectional views of the production steps in the third embodiment of the invention.

As shown in FIG. 3A, a first insulating layer 301 is formed on a substrate 300. The insulating layer 301 can be made of $SiO_2$ or $Si_xN_y$ using the chemical vapor deposition (CVD) method.

Figure 3B:

With reference to FIG. 3B, a source 308a and a drain 308b are formed on the first insulating layer 301. The detailed steps include using metal sputtering to form a metal layer (not shown) on the first insulating layer 301 and using photolithography and etching to form the source 308a and the drain 308b. They are separated by a gap 304. The metal can be titanium.

Figure 3C:
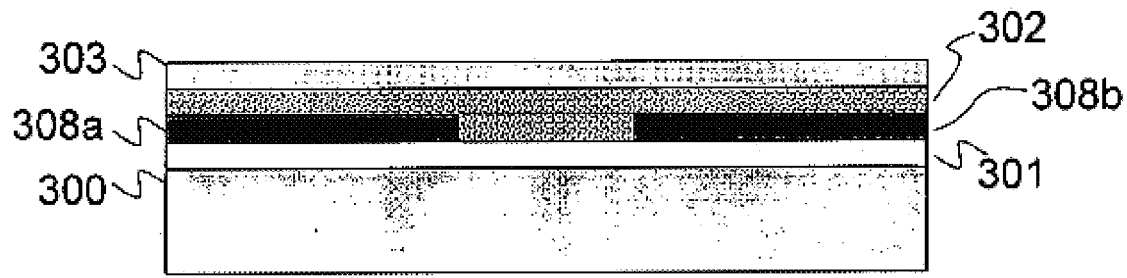

As shown in FIG. 3C, a first oxide layer 302 with a catalyst and a second oxide layer 303 with no catalyst are formed on the substrate 300 that has the source 308a, the drain 308b, and the first insulating layer 301. To form the first oxide layer, one first prepares a coating solution and applies the coating solution on the source 308a and the drain 308b by the SOG method, filling the gap 304. Afterwards, the coating solution layer (not shown) covering the source 308a, the drain 308b, and the gap 304 is dried. The coating solution for the first oxide layer 302 consists of at least a solution containing TEOS, pure alcohol and catalyst ions. One can also add an ammonia solution ($NH_4OH$+alcohol). The catalyst ion can be cobalt, nickel, or iron ion. To form the second oxide layer 303, one first prepares a coating solution and applies the coating solution on the first oxide layer 302 by the SOG method. Afterwards, the coating solution (not shown) on the first oxide layer is dried. The coating solution here consists of at least a TEOS solution.

Figure 3D:
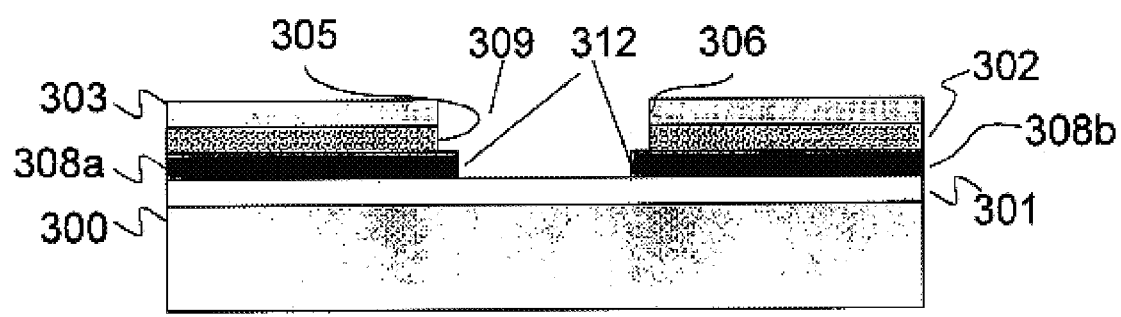

As shown in FIG. 3D, after exposure and developing using a mask, a blind hole 309 is formed by dry or wet etching. The blind hole 309 exposes part of the insulating layer 301, the sidewall 305 of the first oxide layer 302, the sidewall 306 of the second oxide layer 303, and some surface and the sidewall 312 of the source 308a and the drain 308b. The sidewall 312 of the source 308a and the drain 308b protrudes from the sidewall 305 of the first oxide layer 302 and the sidewall 306 of the second oxide layer 303.

Figure 3E:
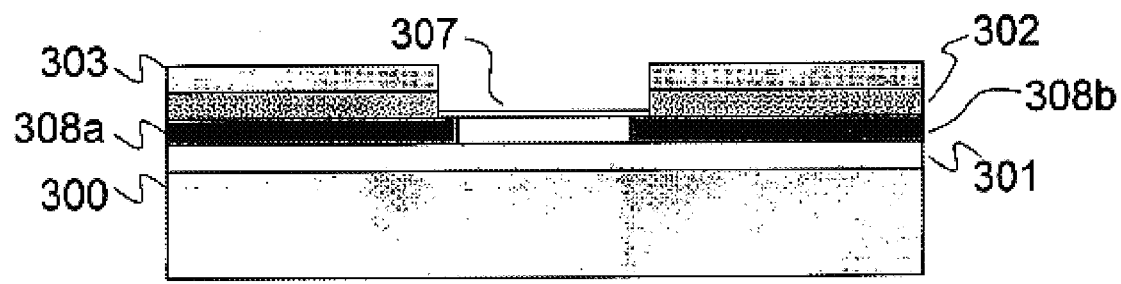

As shown in FIG. 3E, a carbon nanotube 307 is formed. Both ends of the carbon nanotube 307 are connected to sidewall 305 of the first oxide layer 302. The alcohol ($C_2H_5OH$) inside the first oxide layer 302 is the reactant for the carbon nanotube 307. It reacts with the catalyst inside the first oxide layer 302 under the temperature of 850° C. The reason it does not form the carbon nanotube between the sidewall 306 of the second oxide layer is that there is no reactant and catalyst in the second oxide layer 303. Thus, the carbon nanotube 307 can be fixed between the sidewall 305 of the first oxide layer 302. Both end of the carbon nanotube 307 are connected to the surfaces of the source 308a and the drain 308b.

Please refer to FIGS. 4A through 4I for the production steps in a fourth embodiment of the invention.

Figure 4A:
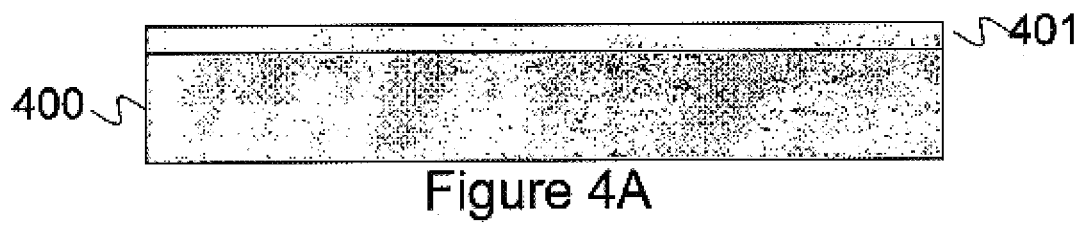

As shown in FIG. 4A, a first insulating layer 401 is formed on a substrate 400. The insulating layer 401 can be made of $SiO_2$ or $Si_xN_Y$ using the chemical vapor deposition (CVD) method.

Figure 4B:
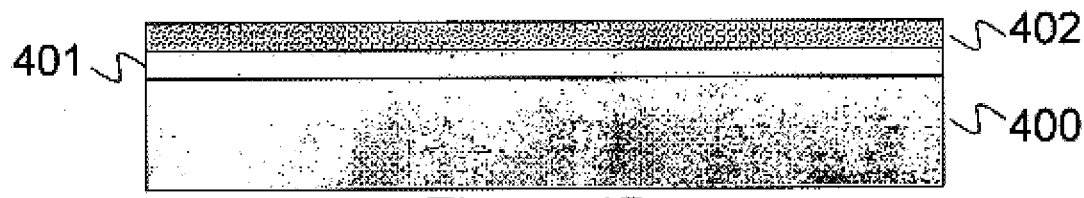

As shown in FIG. 4B, a first oxide layer 402 with a catalyst is formed on the first insulating layer 401. First, one prepares a coating solution and applies it on the first insulating layer 401 by the SOG method. Afterwards, the coating solution layer (not shown) on the first insulting layer 401 is dried in two steps. The coating solution consists at least a solution containing TEOS, pure alcohol and catalyst ions. One can further add an ammonia solution ($NH_4OH$+ alcohol). The catalyst ion can be one of the cobalt, nickel, and iron ions. The two-step drying includes drying under the temperature of 100~120° C. for one hour and then under the temperature of 350~500° C. for another hour.

Figure 4C:

As shown in FIG. 4C, a second oxide layer 403 with no catalyst is formed on the first oxide layer 402. To form the second oxide layer 403, one first prepares a coating solution and applies it on the first oxide layer 402 by the SOG method. Afterwards, the coating solution layer (not shown) on the first oxide layer 402 is dried. The coating solution here consists at a TEOS solution.

Figure 4D:
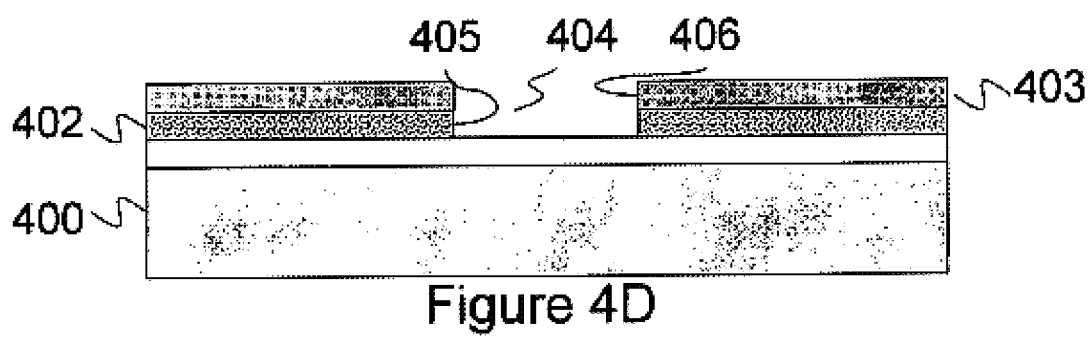

As shown in FIG. 4D, after exposure and developing using a mask, a blind hole 404 is formed by dry or wet etching. The blind hole 404 exposes part of the insulating layer 401, the sidewall 405 of the first oxide layer 402, and the sidewall 406 of the second oxide layer 403.

Figure 4E:
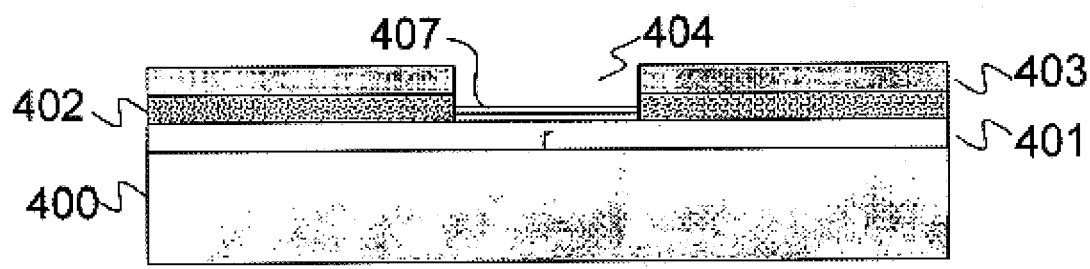

As shown in FIG. 4E, a carbon nanotube 407 is formed. Both ends of the carbon nanotube 407 are connected to the sidewall 405 of the first oxide layer 402. The alcohol ($C_2H_5OH$) inside the first oxide layer 302 is the reactant for the carbon nanotube 307. It reacts with the catalyst inside the first oxide layer 302 under the temperature of 850° C. The reason it does not form the carbon nanotube between the sidewall 306 of the second oxide layer is that there is no reactant and catalyst in the second oxide layer 403. Thus, the carbon nanotube 407 can be fixed between the sidewall 405 of the first oxide layer 402.

Figure 4F:
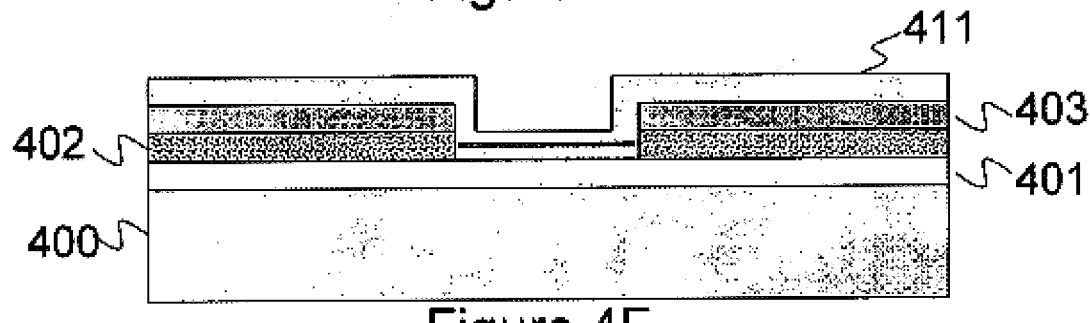

As shown in FIG. 4F, a second insulating layer 411 is formed on the second oxide layer 403 that contains the blind hole 404. The second insulating layer 411 deposited in the blind hole 404 covers the carbon nanotube 407 and pushes it down for the carbon nanotube 407 to touch the first insulating layer 401.

As shown in FIG. 4G, a photoresist pattern 413 is formed by photolithography to fill the blind hole 404 and to cover part of the second insulating layer 411 at the blind hole 411. The photoresist pattern 413 does not cover the second insulating layer 411 outside the blind hole.

As shown in FIG. 4H, the area uncovered by the photoresist pattern 413 is removed by wet etching. The removed part includes the first oxide layer 402 and the second oxide layer 403 that are not covered by the photoresist pattern 413. After the photoresist pattern 413 is removed, one is left with the carbon nanotube 407 on the first insulating layer and the protruding part 412 covering the carbon nanotube 407 and above the second insulating layer 411. The protruding part 412 of the second insulating layer exposes both ends 407a, 407b of the carbon nanotube 407.

As shown in FIG. 4I, a source 408a and a drain 408b are connected to the two ends 407a, 407b of the carbon nanotube 407. The forming steps include first depositing a metal layer (not shown) on the first insulating layer 401 that contains the second insulating layer 414, and then using photolithography and etching processes to form the source 408a and the drain 408b from the metal layer.

Certain variations would be apparent to those skilled in the art, which variations are considered within the spirit and scope of the claimed invention.

What is claimed is:

1. A manufacturing method of carbon nanotube transistors, comprising the steps of:
    forming an insulating layer on a substrate;
    forming a first oxide layer on the insulating layer by the spin-on-glass (SOG) method;
    forming a second oxide layer on the first oxide layer by the SOG method;
    forming a blind hole on the second oxide layer by exposing, developing, and etching, the blind hole exposing the insulating layer, the first oxide layer, and the sidewall of the second oxide layer;
    forming a carbon nanotube inside the blind hole, both ends of the carbon nanotube connecting to the opposite sidewalls of the first oxide layer; and
    forming a source and a drain on the second oxide layer, the source and the drain being separated by the blind hole and connecting to the two ends of the carbon nanotube, respectively.

2. The manufacturing method of claim 1, wherein the insulating layer is comprised of a chemical selected from $SiO_2$ and $Si_xN_y$.

3. The manufacturing method of claim 1, wherein the insulating layer is formed by chemical vapor deposition (CVD).

4. The manufacturing method of claim 1, wherein the means of forming the first oxide layer includes the steps of: preparing a first oxide layer coating solution, applying the first oxide layer coating solution on the substrate by the SOG method, and drying the applied first oxide layer coating solution.

5. The manufacturing method of claim 4, wherein the first oxide layer coating solution comprises at least a solution containing TEOS, pure alcohol and catalyst ions.

6. The manufacturing method of claim 5, wherein the catalyst ions are selected from the group consisting of iron ions, cobalt ions, and nickel ions.

7. The manufacturing method of claim 5 further comprising an ammonia solution.

8. The manufacturing method of claim 1, wherein the means of forming the second oxide layer includes the steps of: preparing a second oxide layer coating solution, applying the second oxide layer coating solution on the substrate by the SOG method, and drying the applied second oxide layer coating solution.

9. The manufacturing method of claim 8, wherein the second oxide coating solution comprises at least TEOS.

10. The manufacturing method of claim 1, wherein the means of forming the carbon nanotube includes the steps of: using the alcohol inside the first oxide layer as a reactant to react with the catalyst ions inside the first oxide layer at a temperature of 850° C.

11. A manufacturing method of carbon nanotube transistors, comprising the steps of:
　forming an insulating layer on a substrate;
　forming a source and a drain, separated by a gap, on the first insulating layer;
　forming a first oxide layer on the source and the drain by the spin-on-glass (SOG) method;
　forming a second oxide layer on the first oxide layer by the SOG method;
　forming a blind hole on the second oxide layer by exposing, developing, and etching, the blind hole exposing the insulating layer, the sidewalls of the source and the drain, the first oxide layer, and the sidewall of the second oxide layer;
　forming a carbon nanotube inside the blind hole, both ends of the carbon nanotube connecting to the opposite sidewalls of the first oxide layer; and
　forming a second insulating layer on the second oxide layer that contains the blind hole.

12. The manufacturing method of claim 11, wherein the second insulating layer presses the carbon nanotube down so that its both ends touch the source and the drain, respectively.

13. The manufacturing method of claim 11, wherein the means of forming a first oxide layer includes the steps of: preparing a first oxide layer coating solution, applying the first oxide layer coating solution on the substrate by the SOG method, and drying the applied first oxide layer coating solution.

14. The manufacturing method of claim 13, wherein the first oxide layer coating solution comprises at least a solution containing TEOS, pure alcohol and catalyst ions.

15. The manufacturing method of claim 14, wherein the catalyst ions are selected from the group consisting of iron ions, cobalt ions, and nickel ions.

16. The manufacturing method of claim 11, wherein the means of forming the carbon nanotube includes the steps of: using the alcohol inside the first oxide layer as a reactant to react with the catalyst ions inside the first oxide layer at a temperature of 850° C.

17. A manufacturing method of carbon nanotube transistors, comprising the steps of:
　forming an insulating layer on a substrate;
　forming a source and a drain, separated by a gap, on the first insulating layer;
　forming a first oxide layer on the source and the drain by the spin-on-glass (SOG) method;
　forming a second oxide layer on the first oxide layer by the SOG method;
　forming a blind hole on the second oxide layer by exposing, developing, and etching, the blind hole exposing the insulating layer, the sidewalls of the source and the drain, the first oxide layer, and the sidewall of the second oxide layer, and the source and the drain protruding from the sidewalls of the first oxide layer and the second oxide layer, and
　forming a carbon nanotube inside the blind hole, the carbon nanotube connecting to the opposite sidewalls of the first oxide layer separated by the blind hole and both ends of the carbon nanotube connecting the surfaces of the source and the drain, respectively.

18. The manufacturing method of claim 17, wherein the means of forming a first oxide layer includes the steps of: preparing a first oxide layer coating solution, applying the first oxide layer coating solution on the substrate by the SOG method, and drying the applied first oxide layer coating solution.

19. The manufacturing method of claim 18, wherein the first oxide coating solution comprises at least a solution containing TEOS, pure alcohol and catalyst ions.

20. The manufacturing method of claim 19, wherein the catalyst ions are selected from the group consisting of iron ions, cobalt ions, and nickel ions.

21. The manufacturing method of claim 17, wherein the means of forming the carbon nanotube includes the steps of: using the alcohol inside the first oxide layer as a reactant to react with the catalyst ions inside the first oxide layer at a temperature of 850° C.

22. A manufacturing method of carbon nanotube transistors, comprising the steps of:
　forming a first insulating layer on a substrate;
　forming a first oxide layer on the first insulating layer by the spin-on-glass (SOG) method;
　forming a second oxide layer on the first oxide layer by the SOG method;
　forming a blind hole on the second oxide layer by exposing, developing, and etching, the blind hole exposing the first insulating layer, the first oxide layer, and the sidewall of the second oxide layer;
　forming a carbon nanotube inside the blind hole, both ends of the carbon nanotube connecting to the opposite sidewalls of the first oxide layer;
　forming a second insulating layer on the second oxide layer that contains the blind hole, the second insulating layer covering the carbon nanotube;
　forming a photoresist pattern at the blind hole by exposing and developing, covering the blind hole and part of the second insulating layer;
　removing the area that is not covered by the photoresist pattern by etching to form a second insulating layer protruding part and exposing the carbon nanotube by the second insulating layer protruding part; and
　forming a source and a drain, separated by the second insulating layer protruding part, on the first oxide, connecting to the carbon nanotube exposed by the second insulating layer protruding part.

23. The manufacturing method of claim 22, wherein the means of forming a first oxide layer includes the steps of: preparing a first oxide coating solution, applying the first oxide layer coating solution on the substrate by the SOG method, and drying the applied first oxide layer coating solution.

24. The manufacturing method of claim 23, wherein the first oxide layer coating solution comprises at least a solution containing TEOS, pure alcohol and catalyst ions.

25. The manufacturing method of claim 24, wherein the catalyst ions are selected from the group consisting of iron ions, cobalt ions, and nickel ions.

26. The manufacturing method of claim 22, wherein the means of forming the carbon nanotube includes the steps of: using the alcohol inside the first oxide layer as a reactant to react with the catalyst ions inside the first oxide layer at a temperature of 850° C.

* * * * *